US005399927A

United States Patent [19]
Gruber et al.

[11] Patent Number: 5,399,927
[45] Date of Patent: Mar. 21, 1995

[54] SOLID STATE BYPASS CIRCUIT FOR RF AND MICROWAVE ACTIVE CIRCUITS

[75] Inventors: Alan H. Gruber, Cedar Grove; Mark G. Simendinger, Lodi; Mitch Sparrow, Wayne, all of N.J.

[73] Assignee: ITT Corporation, New York, N.Y.

[21] Appl. No.: 162,714

[22] Filed: Dec. 3, 1993

[51] Int. Cl.⁶ .................. H03K 17/687; H03K 17/06
[52] U.S. Cl. ................................. 327/379; 333/103; 330/51; 327/404
[58] Field of Search ............ 307/571, 572, 242, 296.8, 307/219, 441, 442; 333/101, 103, 104; 330/51, 124 R

[56] References Cited

U.S. PATENT DOCUMENTS

| | | |
|---|---|---|
| 3,223,940 | 12/1965 | Early et al. |
| 4,691,126 | 9/1987 | Splett et al. ................ 307/219 |
| 4,733,203 | 3/1988 | Ayasli ........................ 307/242 |
| 4,920,285 | 4/1990 | Clark et al. ................. 307/571 |
| 5,093,667 | 3/1992 | Andricos .................... 342/372 |

*Primary Examiner*—Timothy P. Callahan
*Assistant Examiner*—Terry L. Englund
*Attorney, Agent, or Firm*—Arthur L. Plevy; Patrick M. Hogan

[57] ABSTRACT

An active circuit comprising a component coupled between an input terminal and an output terminal, the component requiring power to operate, and a bypass path which causes a signal to propagate from the input terminal to the output terminal via the component when the component is operating under power and which causes the signal to bypass the component, when the circuit loses power, and propagate from the input terminal to the output terminal via a section of transmission line, the bypass path comprising a bypass circuit having at least two FETs, the two FETs providing high and low impedances, the high impedance being provided when the component is operating, thereby causing the signal to propagate from the input terminal to the output terminal via the component and the low impedance being provided when the circuit loses power, thereby causing the signal to propagate from the input terminal via the section of transmission line to the output terminal. The active circuit according to the present invention further comprises at least four PIN diodes for preventing an output signal feedback at the input terminal.

16 Claims, 7 Drawing Sheets

SOLID STATE BYPASS CIRCUIT FOR RF AND MICROWAVE ACTIVE CIRCUITS

FIELD OF INVENTION

This invention relates generally to bypass circuits for routing critical signals around disabled components, and more particularly, to bypass circuits utilizing solid state components for routing critical signals around radio frequency (RF) and microwave active devices.

BACKGROUND OF THE INVENTION

Radio frequency and microwave circuits include active or power driven components, such as amplifiers and the like, which form an operational path for signals passing between the input and output terminals of the path. Circumstances sometime exist when it is critical from a reliability standpoint, for these signals to be always capable of passing between the input and output terminals. As such, it is often necessary to provide a bypass path around these components in the event of a component disablement due to a loss of supply power. The bypass path routes around the disabled component while maintaining continuous, but degraded system performance. Such a circumstance would involve signals propagating in a communication or data application. In these cases, disablement would involve a loss of communication as well as data. Prior art bypass circuits typically employ two electromechanical relays, and RF transmission line configuration. During normal operation, system operating voltage is applied to the coil windings of the relays which hold the contacts in a position which causes the signal to pass through the component. In the event of a power loss, the relays release the contacts, and the signal is then routed around the disabled component via a section of transmission line. These arrangements operate over a very wide bandwidth, and contribute only a small loss in signal level.

Prior art bypass circuits, however, exhibit several problems related to reliability, size, and power consumption. In the operating mode, the relay coils must be energized which consumes a significant amount of electrical power. This reduces the efficiency of the system and requires a larger power supply. Furthermore, additional heat is generated by the relays which must be dissipated. Reliability of the circuit suffers because the contact system of the relays is typically required to make and/or break millions of times and provide a low, stable electrical resistance over the lifetime of the relays. Because of the numerous operations and arcing often occurring during operation, the contacts are subject to a wide variety of hazards that may cause failure. Moreover, electromechanical relays have other disadvantages including their physical size; they can generate radio frequency interference (RFI) by switching of their coils, thereby requiring special shielding to isolate the RFI; their switching speed is slower compared to solid state components of like function; and generally they occupy more space than the component being bypassed.

The present invention solves the problems of prior art bypass circuits by using all solid state components including field-effect-transistors (FETs) and PIN diodes. Solid state components operate at very low power levels. For this reason, utilization of solid state components in bypass circuits insures high reliability, low power dissipation, and very small size.

A FET is a voltage-controlled semiconductor device in which the current conduction between the source and the drain regions is controlled or modulated by means of a control voltage applied to the gate electrode. For an example of FETs used as switching devices at microwave frequencies, see U.S. Pat. No. 5,093,667 issued on Mar. 3, 1992 entitled "T/R MODULE WITH ERROR CORRECTION" by C. Andricos and assigned to ITT Corporation.

A PIN diode is a semiconductor device used as a switch or attenuator in microwave transmission lines. PIN diodes include an undoped high-resistivity region between p and n regions. This central region is typically a lightly doped p-layer or lightly doped n-layer. Both FET's and PIN diodes are available for operation in the microwave range.

During normal operation, the circuit according to the present invention, consumes approximately 20 milliwatts of dc power, compared to several watts for prior art bypass circuits which utilize electromechanical relays. In the bypass mode, the present invention uses no power. Solid state components generally include no moving parts and as such can be cycled on and off nearly an infinite number of cycles.

It is, therefore, an object of the present invention to provide a bypass circuit for bypassing a signal around disabled component located in a critical signal path, which utilizes all solid state components to reduce the power consumption of the bypass circuit, insures high reliability of the bypass circuit, and reduces the size of the bypass circuit.

SUMMARY OF THE INVENTION

A circuit having an active component which under normal operating conditions propagates a signal between an input terminal and an output terminal, and a bypass circuit for bypassing the active component and propagating the signal form the input terminal to the output terminal via a section of transmission line under conditions in which the active component loses power, the bypass circuit comprising first and second field-effect-transistors, the first field-effect-transistor being coupled at a first junction located between the input terminal and the active component and the second field-effect-transistor being coupled at a second junction located between the active component and the output terminal wherein the first and second field-effect-transistors provide a first state of substantially high impedance and a second state of substantially low impedance, the first state providing a path under the normal operating conditions wherein the active component propagates the signal from the input terminal to the output terminal, the second state providing a path around the active component under the condition in which the component loses power wherein the signal propagates from the input terminal to the output terminal via the section of transmission line. The bypass circuit further comprises first, second, third, and fourth PIN diodes, the first diode being series coupled between the first junction and the active component, the second diode being series coupled between the component and the junction, the third diode being shunt coupled between the first field-effect-transistor and the section of trammission line and the fourth diode being shunt coupled between the section of transmission line and the second field-effect-transistor wherein the first, second, third, and fourth diodes prevent output signal feedback at the input terminal.

DETAILED DESCRIPTION OF THE INVENTION

Figure 1:
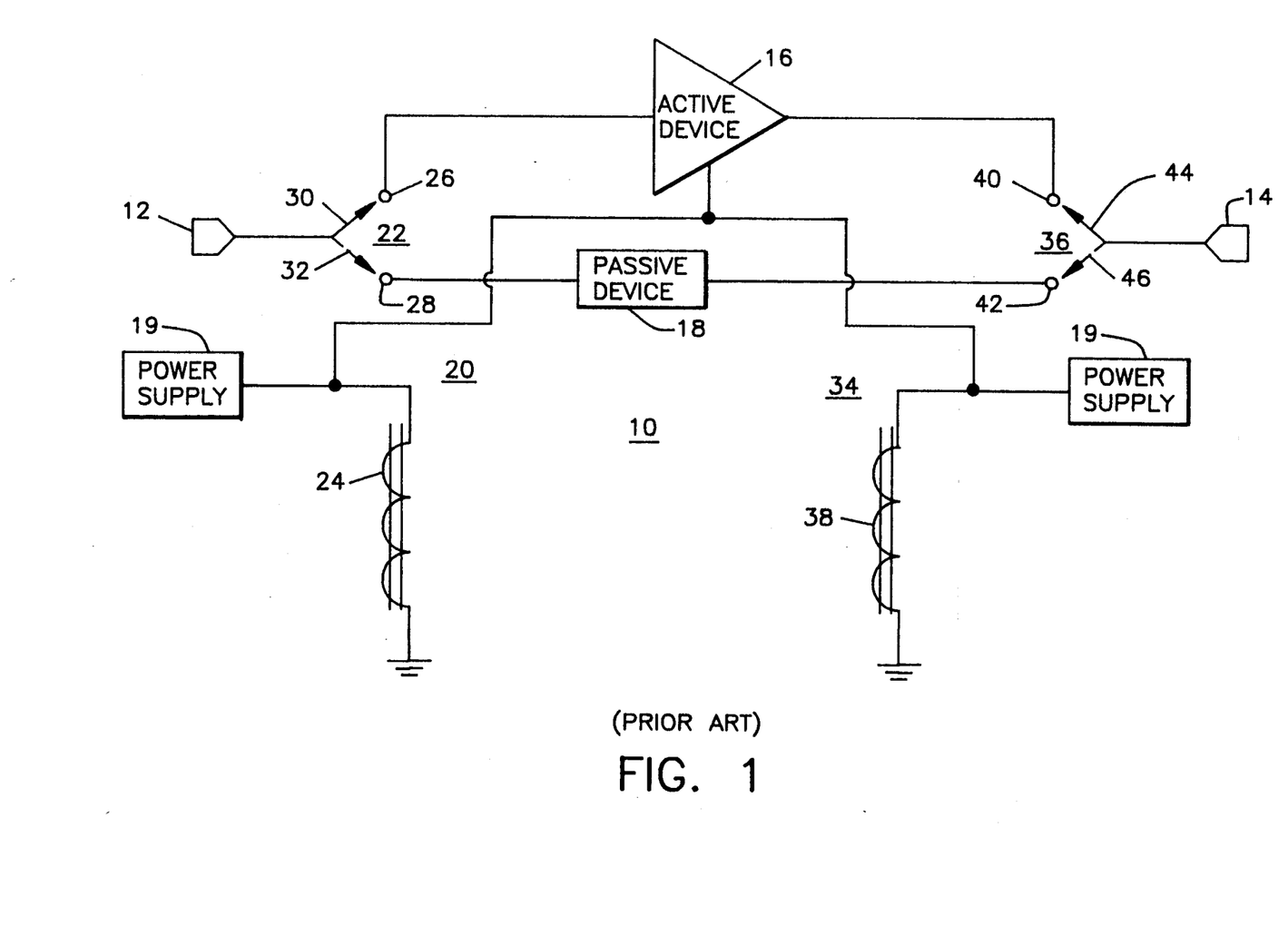
FIG. 1 is a circuit diagram of a prior art bypass circuit.

Referring to FIG. 1, there is shown a prior art bypass circuit designated by the numeral 10. This bypass circuit 10 provides a bypass path around component or active device 16. Active device 16 forms an operational path between input terminal 12 and output terminal 14 and is coupled to a power supply 19. Active device 16 can be any component which requires power to operate, for example, an amplifier and will pass a signal from the input terminal 12 to the output terminal 14.

The bypass circuit 10 comprises a pair of relays 20 and 34 coupled together by a section of RF transmission line 18. Relays 20 and 34 can be well known REED relays or other similar relays. Transmission line 18 is a passive device requiring no power to operate and functions to transmit the signal between the relays 20 and 34 in the bypass mode. Relay 20 includes a contact 22, contact terminals 26 and 28 and a coil winding 24. Contact terminal 26 of relay 20 is coupled to the input terminal of active device 16. The coil winding 24 of relay 20 is coupled to power supply 19. Relay 34 includes a contact 36, contact terminals 40 and 42 and coil winding 38. Contact terminal 40 of relay 34 is coupled to the output terminal of the active device 16. The coil winding 38 of relay 34 is coupled to power supply 19. RF transmission line 18 is coupled between contact terminals 28 and 42 of respective relays 20 and 34.

During normal operation, voltage from the power supply 19 is applied to active device 16 and to coil windings 24 and 38 of relays 20 and 34 respectively, which hold respective contacts 22 and 36 in respective energized positions 30 and 44. In the event of a loss of supply voltage, relays 20 and 34 release respective contacts 22 and 36 into deenergized positions 32 and 46 respectively. The signal being routed from input terminal 12 along the operational path is then routed around the active device 16 via transmission line 18 to output terminal 14.

Figure 2:
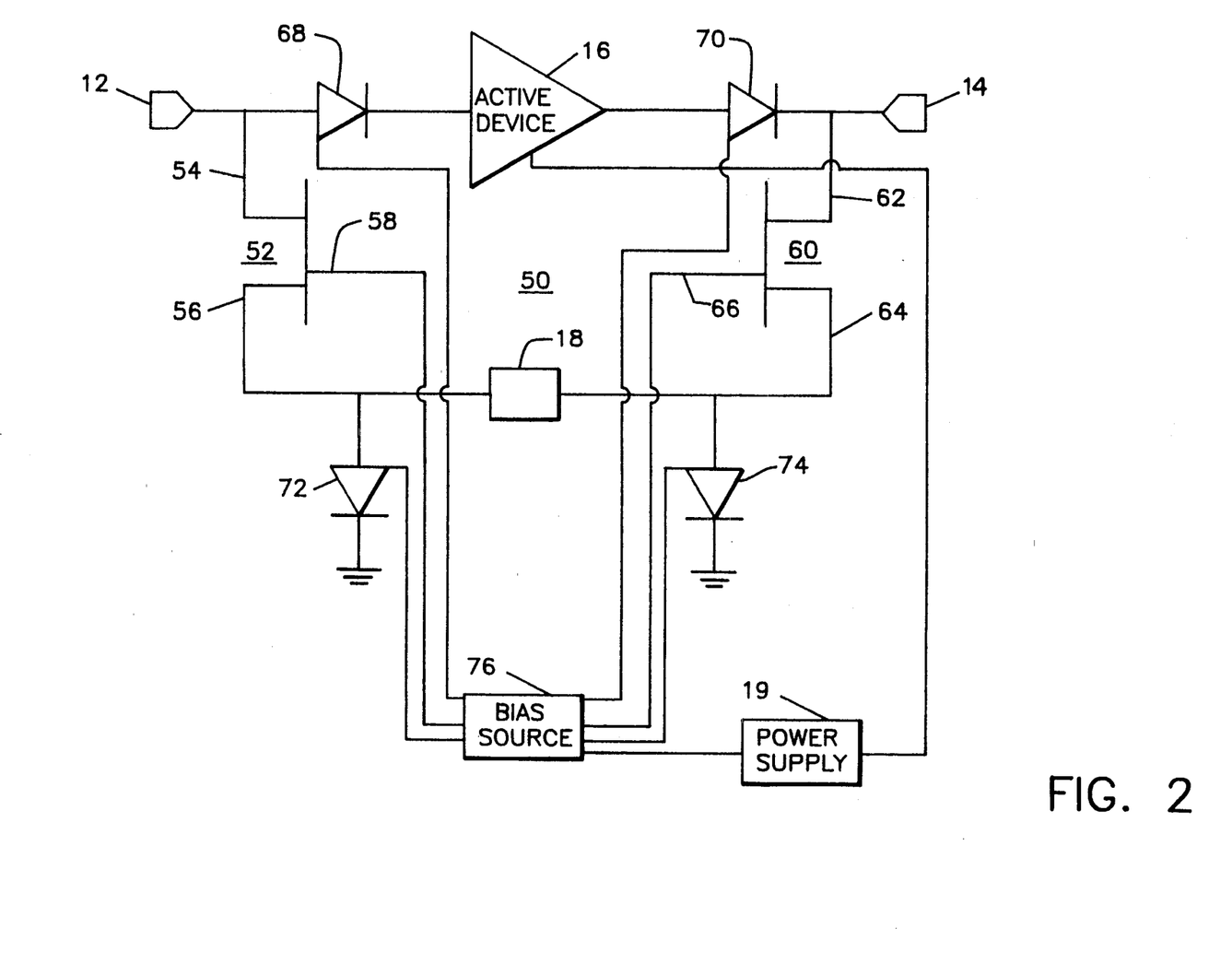
FIG. 2 is a circuit diagram of a preferred embodiment of the present invention.

Referring now to FIG. 2 there is shown a preferred embodiment of the present invention, a bypass circuit utilizing all solid state components, designated by the numeral 50. Note that like elements/numerals refer to the comparison of elements/numerals on FIGS. 1 and 2.

Bypass circuit 50 provides a bypass path around active device 16 and comprises two or more semiconductor field-effect-transistors 52 and 60 (FETS) preferably made from gallium arsenide, four PIN diodes 68, 70, 72, and 74, and a dc bias source 76. Just as in FIG. 1, active device 16 forms an operational path between input terminal 12 and output terminal 14 when coupled to power supply 19.

FET 52 includes a source terminal or electrode 54, a drain terminal 56, and a control gate terminal 58. Source terminal 54 of FET 52 is coupled between input terminal 12 and the anode terminal of a series coupled PIN diode 68. The cathode terminal of PIN diode 68 is coupled to the input terminal of active device 16. Control gate terminal 58 of FET 52 is coupled to dc bias source 76. Source terminal 62 of FET 60 is coupled between the cathode terminal of a series coupled PIN diode 70 and output terminal 14. The anode terminal of PIN diode 70 is coupled to the output terminal of active device 16. The control gate terminal 66 of FET 60 is coupled to dc bias source 76. Drain terminal 56 of FET 52 and the input terminal of RF transmission line 18 are coupled to the anode terminal of shunt coupled diode 72. The output terminal of RF transmission line 18 and drain terminal 64 of FET 60 are coupled to the anode terminal of PIN diode 74. The cathode terminals of shunt coupled PIN diodes 72 and 74 are grounded. The dc bias source 76 is also coupled to each of the PIN diodes.

Figure 3:
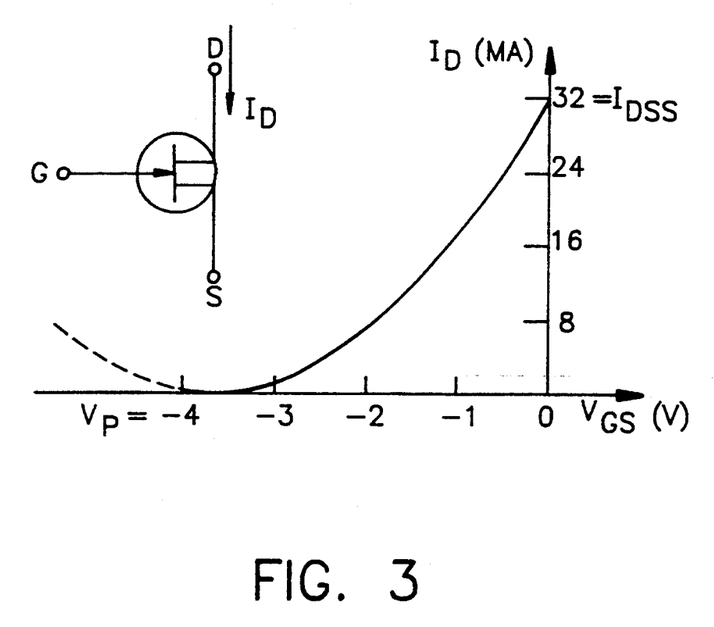
FIG. 3 illustrates the typical DC characteristics of a GaAs FET.
Figure 4:
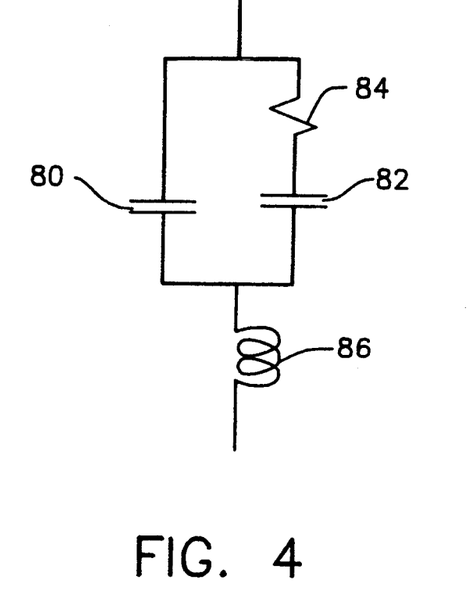
FIG. 4 illustrates an electrical equivalent circuit of a GaAs switch FET in the off state.
Figure 5:
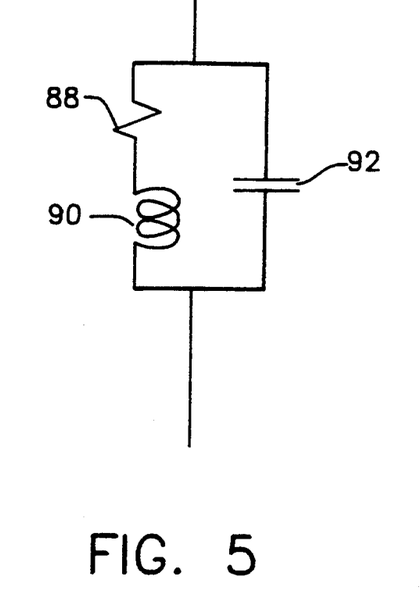
FIG. 5 illustrates an electrical equivalent circuit of a GaAs switch FET in the on state.

The GaAs FETs of the present invention are specifically designed to operate as switches at RF and microwave frequencies. FIG. 3 illustrates the DC characteristics of a FET. At zero volts bias applied to the control gate, the FET is in a conducting "on" state. When a negative voltage bias is applied to the control gate, the FET stops conducting, and assumes a high resistance "off" state. The electrical equivalent circuit of a FET in the "off" state includes an inductor 86 series coupled to a circuit including capacitor 80 shunt coupled to series coupled resistor 84 and capacitor 82 as shown in FIG. 4. The electrical equivalent circuit of the FET in the "on" state includes resistor 88 series coupled to inductor 90 which are shunt coupled to capacitor 92 as shown in FIG. 5. Table 1 below gives the equivalent circuit values for the models illustrated in FIGS. 4 and 5.

TABLE 1

| SMALL SIGNAL EQUIVALENT CIRCUIT MODEL VALUES ON = 0 VOLTS, OFF = −4 VOLTS, T = 25° C. ||
|---|---|
| PARAMETER | UNITS |
| ROFF = 3.5/W | Ω |
| C1 = .107*W | pF |
| C2 = .284*W | pF |
| Loff = .023*W | nH |
| Ron = 4.1/W | Ω |
| C = .283*W | pF |
| Lon = .014*W + .065 | nH |

W = Gate width in mm
VALID FROM DC TO 8 GHz

Figure 6:
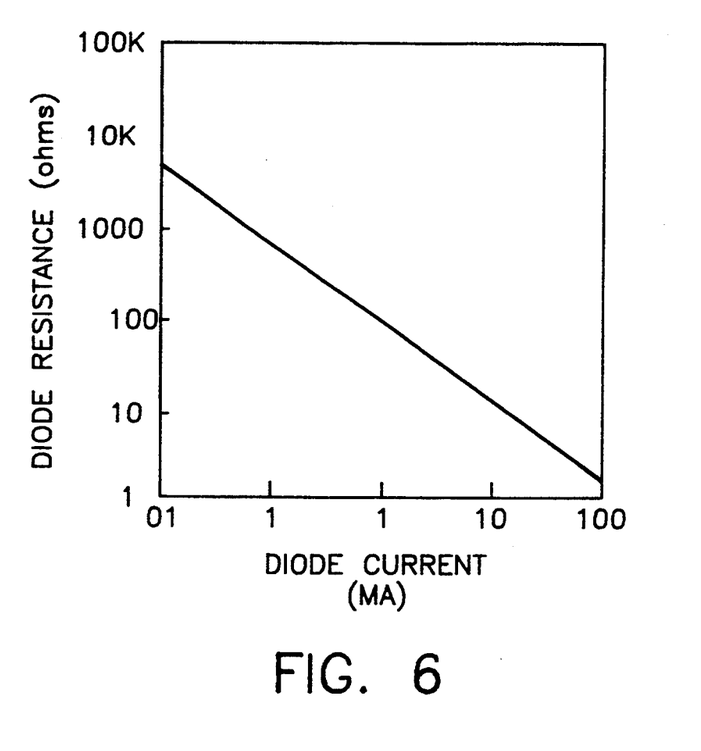
FIG. 6 illustrates the resistance vs. bias current for a PIN diode.
Figure 7:
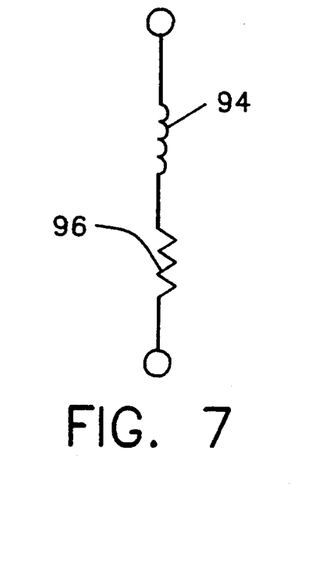
FIG. 7 illustrates an electrical equivalent circuit of a PIN diode in the on state.
Figure 8:
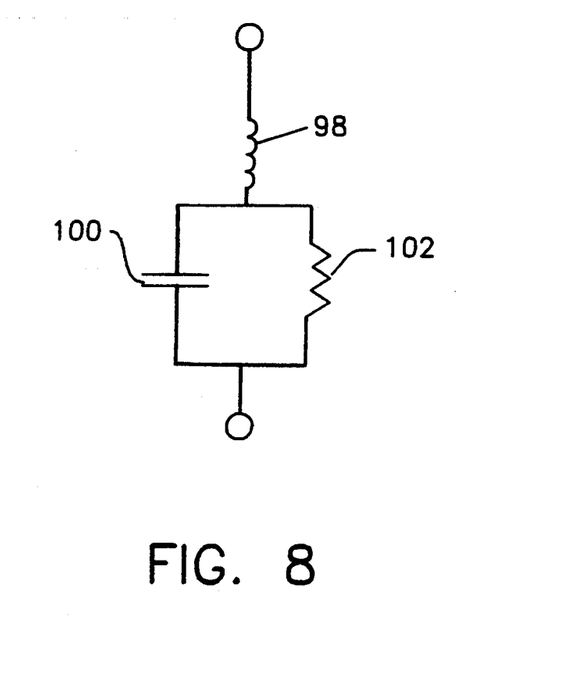
FIG. 8 illustrates an electrical equivalent circuit of a PIN diode in the off state.

FIG. 6 illustrates the resistance vs. bias current characteristics for a PIN diode. The PIN diode exhibits characteristics opposite to the FETs. As can be seen in FIG. 6, with no bias applied, a PIN diode is considered in a high resistance "off" state When 10 ma. of current is passed through the diode, its resistance drops to a very low value and it assumes an "on" state or "conductance" state. The electrical equivalent circuit of a PIN diode in the "off" state includes inductor 98 series coupled to a circuit including capacitor 100 shunt coupled to resistor 102 as shown in FIG. 8. The electrical equivalent circuit of a PIN diode in the "on" state includes an inductor 94 coupled in series to resistor 96 as shown in FIG. 7.

When component or active device 16 is operating normally, bias is applied to both FETs and all four PIN diodes. Negative bias is applied to both FETs at the control gate terminal which stops the FETs from conducting as the FETs are in the high resistance "off" state. This causes the signal received at the input terminal to pass to the output terminal via the active device 16. The series coupled PIN diode 68 conducts the signal received at the input terminal 12 into the operating active device 16. The FETs and PIN diodes prevent the output signal from feeding back into the input terminal causing an oscillation condition. In the event that active device 16 loses power, bias is removed from all of the semiconductor devices. When this occurs, the FETs fall into the conducting "on" state and the signal at the input terminal is routed through FET 52 to transmission line 18, through FET 60, and to the output terminal 14.

Figure 9:
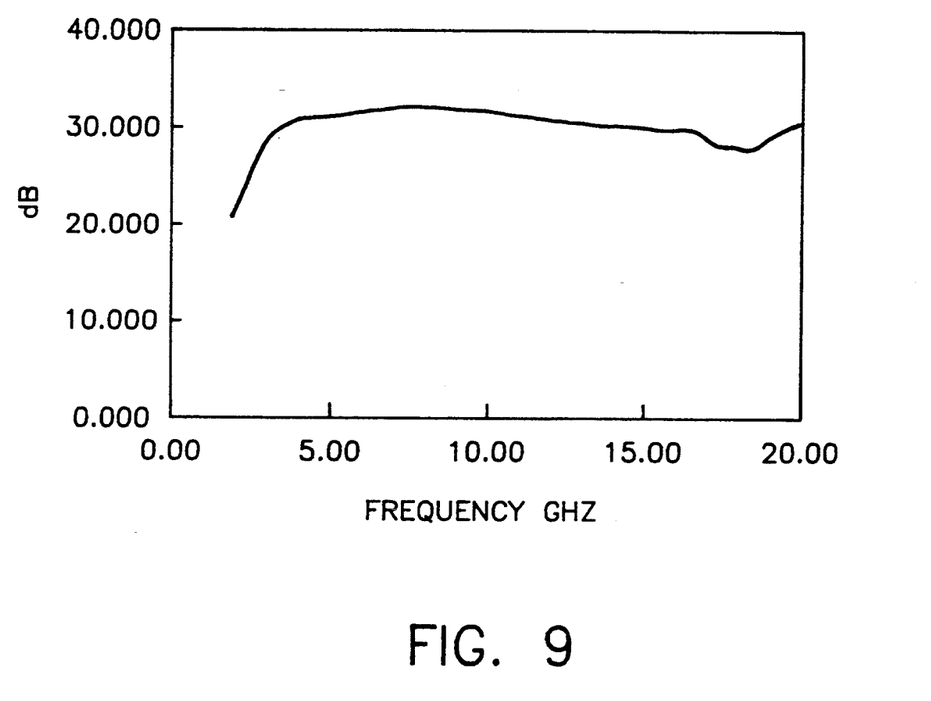
FIG. 9 is a computer simulation showing the frequency response of a microwave circuit with the bypass circuit of the present invention in the off mode.
Figure 10:
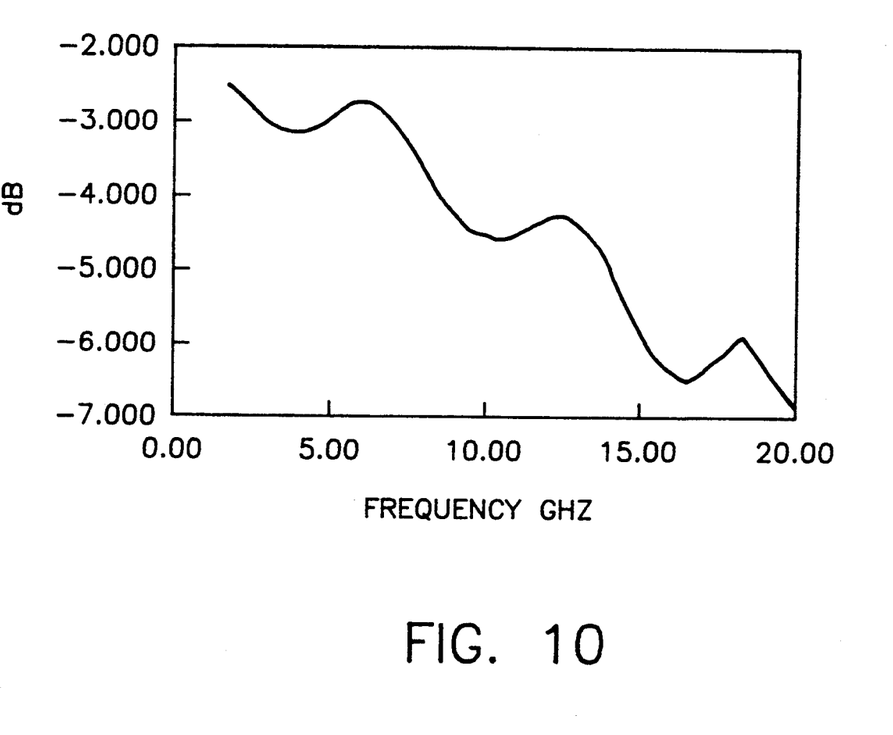
FIG. 10 is a computer simulation showing the frequency response of the bypass circuit of the present invention in the on mode.

Computer simulations of the circuit according to the present invention are shown in FIGS. 9 and 10. For these simulations, HEWLETT PACKARD HPND-4018 PIN diodes and ITTGTC 1SSWT class B co-implant process, 60 μm switching FETs were implemented. The active device being bypassed was a broadband amplifier with 30 dB gain from 2 to 20 GHz. FIG. 9 shows a maximum loss of 7 dB is predicted in the normal operation mode. FIG. 10 shows a maximum loss of 8 dB is predicted in the bypass mode. Loss in either mode can be significantly reduced by optimizing the selection of the PIN diodes and the FETs for the desired frequency band of operation.

It is understood that the embodiment described herein, including the number of FETs and PIN diodes employed are merely exemplary and that a person skilled in the art may make many variations and modifications to the described embodiment utilizing functionally equivalent elements to those described. For instance, any equivalent PIN diode and FET semiconductor devices can be implemented in the circuit according to the present invention. Moreover, operation of the circuit is not limited to the aforementioned frequencies and can easily function above and below those frequencies if desired. Any variations or modifications to the invention described herein are intended to be included within the scope of the invention as defined by the appended claims.

We claim:

1. In a circuit of the type having a component coupled between an input terminal and an output terminal, said component requiring power to operate, and a bypass circuit which causes a signal to propagate from said input terminal to said output terminal via said component when said component is operating and which causes the signal to bypass said component, when said circuit loses power, and propagate from said input terminal to said output terminal via a section of transmission line, said bypass circuit being characterized in that it comprises:

at least two field-effect-transistors, said at least two field-effect-transistors providing a first state when said component is operating, which causes the signal to propagate from said input terminal to said output terminal via said component and a second state when said circuit loses power which causes the signal to propagate from said input terminal via said section of transmission line to said output terminal wherein said bypass circuit further comprises first, second, third, and fourth PIN diodes, said first and second PIN diodes being coupled with said component between said input terminal and said output terminal, and said third and fourth PIN diodes being coupled with said section of transmission line.

2. The circuit according to claim 1, wherein said first state is a substantially high impedance state and said second state is a substantially low impedance state.

3. The circuit according to claim 1, wherein one of said at least two field-effect-transistors is coupled at a first junction located between said input terminal and said component and the other of said at least two field-effect-transistors is coupled at a second junction located between said component and said output terminal.

4. The circuit according to claim 1, wherein said at least two field-effect-transistors are negatively biased when said component is operating under power.

5. The circuit according to claim 1, wherein said component is an amplifier.

6. The circuit according to claim 1, wherein said at least two field-effect-transistors are capable of operating at microwave frequencies.

7. The circuit according to claim 1, wherein said at least two field-effect-transistors are Gallium Arsenide.

8. An active circuit for powering a first path by way of a component coupled between an input and an output terminal, said component operating under power to propagate a signal from said input terminal to said output terminal, said active circuit comprising:

a second path which allows said signal to bypass said component, when said circuit loses power, and propagate from said input terminal to said output terminal by way of a section of transmission line, said second path comprising a bypass circuit having solid state switching means, said solid state switching means providing a non-conducting state and a conducting state, said non-conducting state being provided when said component is propagating said signal from said input terminal to said output terminal, said conducting state being provided to propagate the signal from said input terminal to said output terminal via said section of transmission line when said circuit loses power;

wherein said bypass circuit further comprises solid state PIN diode means for preventing output signal feedback at said input terminal.

9. The active circuit according to claim 8, wherein said solid state switching means comprises at least two field-effect-transistors.

10. The active circuit according to claim 9, wherein said at least two field-effect-transistors are Gallium Arsenide.

11. The active circuit according to claim 9, wherein one of said at least two field-effect-transistors is coupled at a first junction located between said input terminal and said component and the other of said at least two field-effect-transistors is coupled at a second junction located between said component and said output terminal.

12. The active circuit according to claim 11, wherein said solid state PIN diode means comprises first, second, third, and fourth PIN diodes, said first PIN diode being coupled between said first junction and said component, said second PIN diode being coupled between said component and said second junction, said third PIN diode being shunt coupled between one of said at least two field-effect transistors and said section of transmission line and said fourth PIN diode being shunt coupled between said section of transmission line and the other of said at least two field-effect transistors.

13. The active circuit according to claim 9, wherein said at least two field-effect-transistors are negatively biased when sad component is opening under power.

14. The active circuit according to claim 12, wherein said at least two field-effect-transistors are capable of operating at microwave frequencies.

15. The active circuit according to claim 14, wherein said at least two field-effect-transistors are Gallium Arsenide.

16. In a circuit of the type having an active component which under normal operating conditions, propagates a signal between an input terminal and an output terminal, and a bypass circuit for bypassing said active component and propagating said signal from said input terminal to said output terminal via a section of transmission line under conditions in which said circuit loses power, said bypass circuit being characterized in that it comprises:

first and second field-effect-transistors, said first field-effect-transistor being coupled at a first junction located between said input terminal and said active component and said second field-effect-transistor being coupled at a second junction located between said active component and said output terminal wherein said first and second field-effect-transistors provide a first state of substantially high impedance and a second state of substantially low impedance, said first state providing a path under said normal operating conditions wherein said active component propagates said signal from said input terminal to said output terminal, said second state providing a path around said active component under said condition in which said circuit loses power wherein said signal propagates from said input terminal to said output terminal via said section of transmission line; and first, second, third, and fourth pin diodes, said first pin diode being series coupled between said first junction and said active component, said second pin diode being series coupled between said component and said second junction, said third pin diode being shunt coupled between said first field-effect-transistor and said section of transmission line and said fourth pin diode being shunt coupled between said section of transmission line and said second field-effect-transistor, wherein said first, second, third, and fourth pin diodes prevent output signal feedback at said input terminal.

* * * * *